United States Patent
Rol et al.

(10) Patent No.: US 10,954,879 B2
(45) Date of Patent: Mar. 23, 2021

(54) METHOD FOR ADAPTING A FUEL INJECTOR CONTROL SIGNAL

(71) Applicants: CONTINENTAL AUTOMOTIVE FRANCE, Toulouse (FR); CONTINENTAL AUTOMOTIVE GMBH, Hanovre (DE)

(72) Inventors: Baptiste Rol, Toulouse (FR); Cédric Benaben, Toulouse (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 0 days.

(21) Appl. No.: 16/759,003

(22) PCT Filed: Oct. 16, 2018

(86) PCT No.: PCT/FR2018/052568
§ 371 (c)(1),
(2) Date: Apr. 24, 2020

(87) PCT Pub. No.: WO2019/081835
PCT Pub. Date: May 2, 2019

(65) Prior Publication Data
US 2020/0340421 A1    Oct. 29, 2020

(30) Foreign Application Priority Data

Oct. 27, 2017    (FR) ...................................... 1760147

(51) Int. Cl.
*F02D 41/26*    (2006.01)
*F02D 41/40*    (2006.01)
*F02D 41/38*    (2006.01)

(52) U.S. Cl.
CPC ............. *F02D 41/40* (2013.01); *F02D 41/26* (2013.01); *F02D 2041/389* (2013.01)

(58) Field of Classification Search
CPC ....... F02D 41/40; F02D 41/26; F02D 41/3005
See application file for complete search history.

(56) References Cited

U.S. PATENT DOCUMENTS 3,766,895 A * 10/1973 Voss ...................... F02D 31/007
                                                              123/355
4,057,042 A * 11/1977 Aono .................. F02D 35/0053
                                                              123/699

(Continued)

FOREIGN PATENT DOCUMENTS

EP    2133541 A1    12/2009

OTHER PUBLICATIONS

International Search Report, dated Jun. 21, 2019, from corresponding PCT application No. PCT/FR2018/052568.

*Primary Examiner* — Thomas N Moulis
(74) *Attorney, Agent, or Firm* — Nixon & Vanderhye

(57) ABSTRACT

Disclosed is a method for adapting a control signal of a control circuit for at least one injector of a combustion engine of a motor vehicle, the control signal being a voltage-pulse signal of variable frequency varying between a minimum frequency and a maximum frequency and which is characterized over a given period by its duty cycle. For a given period of the control signal, the method includes determining the start time of the given period and of detecting the first pulse in the given period from the start time and, when the duration of the detected first pulse is included in a minimum time interval beginning at the start of the given period and the duration of which is dependent on the maximum frequency, modifying the duration of the (Continued)

detected first pulse so that the duration becomes equal to the duration of the minimum time interval.

20 Claims, 3 Drawing Sheets

(56) References Cited

U.S. PATENT DOCUMENTS

| | | | | |
|---|---|---|---|---|
| 4,096,830 | A | * | 6/1978 | Long ................ F02D 21/08 123/491 |
| 4,365,202 | A | | 12/1982 | Sinniger |
| 4,841,938 | A | * | 6/1989 | Weibler ............ G01F 1/6842 123/494 |
| 10,612,485 | B2 | * | 4/2020 | Radeczky .......... F02M 51/0603 |
| 2002/0029098 | A1 | | 3/2002 | Sakurai et al. |
| 2010/0147262 | A1 | * | 6/2010 | Martin .............. F02D 19/066 123/299 |
| 2011/0120423 | A1 | * | 5/2011 | Borchsenius ........ F02D 41/34 123/494 |
| 2016/0053730 | A1 | | 2/2016 | Meyer et al. |
| 2019/0055896 | A1 | * | 2/2019 | Horiuchi ............ F02D 41/401 |

* cited by examiner

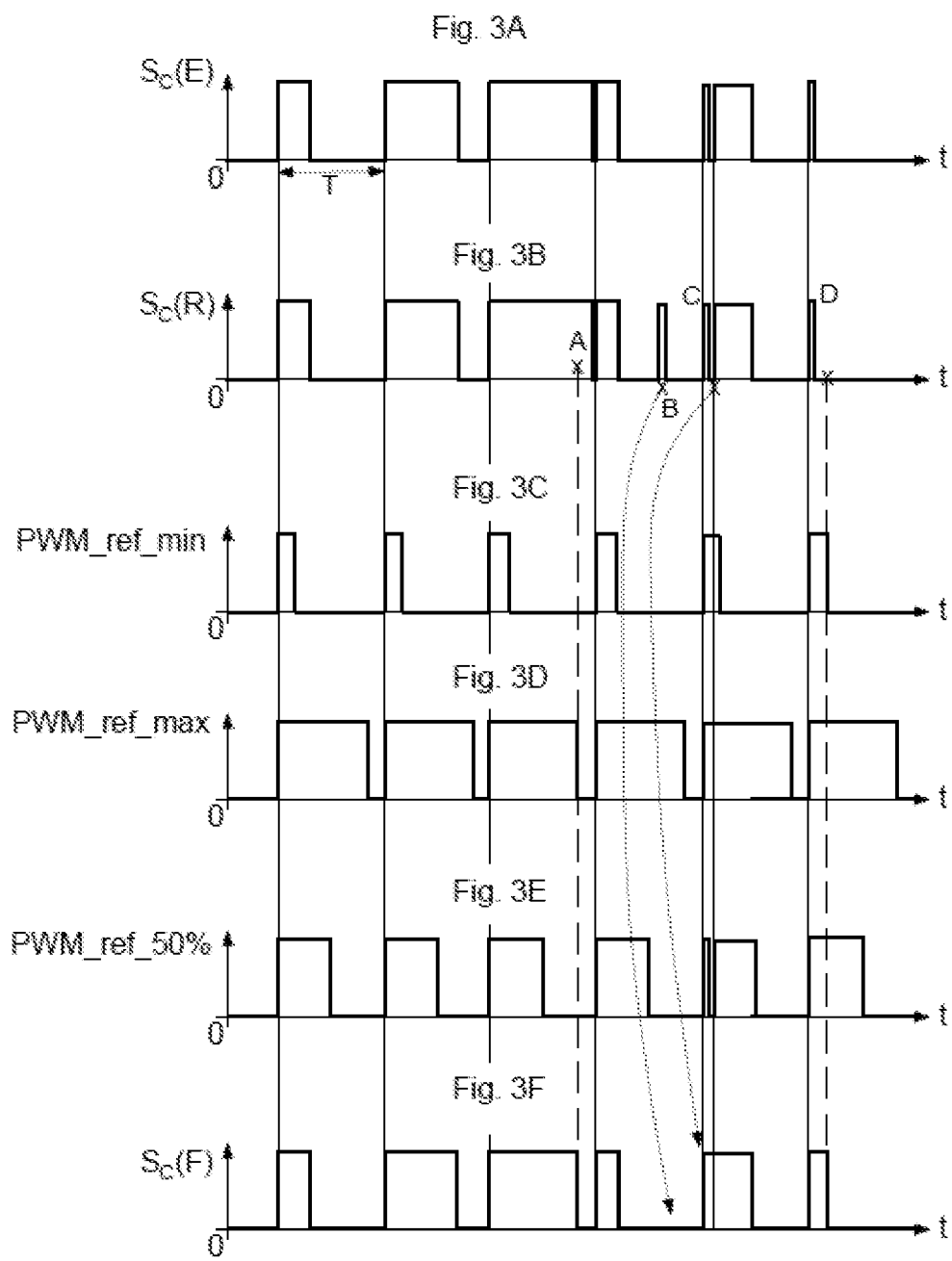

METHOD FOR ADAPTING A FUEL INJECTOR CONTROL SIGNAL

BACKGROUND OF THE INVENTION

Field of the Invention

The invention relates to the field of fuel injection control and relates more specifically to a method and a computer for adapting a control signal of a control circuit for at least one injector of a combustion engine of a motor vehicle.

The invention aims in particular to avoid latch-up of the control circuit for the injectors in order to reduce the number of control errors in said injectors.

Description of the Related Art

In known manner, a vehicle with a combustion engine comprises injectors for injecting the fuel into the cylinders of the engine.

The opening and closing of each injector is controlled by a computer on board the vehicle. More specifically, the computer comprises a microcontroller, an integrated circuit known as a "control circuit" which is an ASIC (application-specific integrated circuit) and a power stage.

In order to control the injectors, the microcontroller generates PWM (pulse width modulation) control signals which it sends to the control circuit. These PWM control signals are in the form of voltage-pulse signals taking alternately high values (for example 1) or low values (for example 0).

The control circuit generates, on the basis of the received PWM control signals, control signals for controlling the injectors which it sends to the power stage so that the latter adjusts said control signals to the appropriate power.

The PWM control signals are controlled in a feedback (or control) loop set up between the microcontroller, the control circuit, the power stage and the injectors which allows injection to be controlled in a regulated manner.

However, the duty cycle of these PWM control signals is not completely regulated and may vary between 0 and 100%, in particular due to electromagnetic interference, electrical-track routing problems, coupling problems, calculation errors in the feedback control (for example due to a coding error), etc.

These effects can create spurious pulses which may lead to the latch-up of the internal circuits of the control circuit and thus confuse the control circuit, leading then to erroneous injector control which could damage the engine.

Spurious pulses can appear in the PWM control signal received at the input of the control circuit in two ways: either the spurious pulse corresponds to a momentary high state of the signal during a programmed low state of the signal, or, conversely, the pulse corresponds to a low state of the signal in the middle of a programmed high state of the signal.

These spurious pulses are in particular liable to generate latch-up effects in the control circuit when the duty cycle of the control signal is close to 0, for example lower than 1%, or close to 100%, for example higher than 99%.

To overcome these drawbacks in part, it is known practice to use a filter on the control circuit to filter out these spurious pulses.

However, the current trend is for the frequency of PWM control signals to increase, reaching values higher than 150 kHz, for example. Consequently, the spurious pulses are becoming very short in duration, for example shorter than 50 ns. Currently, manufacturers of control circuits, in particular ASICs, do not guarantee that such short-duration pulses are filtered out.

Furthermore, it may also happen that there is an error in the programming code of the microcontroller which generates a high state of the control signal over an entire period.

In both cases, when these spurious pulses or these programming errors generate a latch-up in the control circuit, the computer controls the injectors incorrectly, which may damage it or result in unwanted behavior of the control circuit causing untimely control of the injectors, which may damage the engine.

SUMMARY OF THE INVENTION

The present invention therefore aims to overcome these drawbacks at least in part by providing a simple, reliable and effective solution for protection against malfunctions of a control circuit which are generated by spurious pulses or programming errors.

To this end, the first subject of the present invention is a method for adapting a control signal of a control circuit for at least one injector of a combustion engine of a motor vehicle, said control signal being a voltage-pulse signal of variable frequency varying between a minimum frequency and a maximum frequency and which is characterized over one period by its duty cycle. Said method is noteworthy in that it comprises, for a given period of the control signal, the steps of:

- detecting the first pulse in the given period;
- when the duration of said detected first pulse is shorter than the duration of a predetermined minimum time interval beginning at the start of the given period and said duration of which is dependent on the maximum frequency, modifying the duration of the detected first pulse so that said duration becomes equal to the duration of said predetermined minimum time interval;
- when the duration of the detected first pulse is longer than the duration of a predetermined maximum time interval starting at the beginning of the given period and said duration of which is dependent on the minimum frequency, modifying the duration of the detected first pulse so that said duration becomes equal to the duration of said predetermined maximum time interval.
- when the control signal becomes zero after the end of the detected first pulse, the duration of which has optionally been modified, removing any other pulse detected at the end of the given period.

The method according to the invention thus makes it possible to filter and adapt the control signal of a control circuit in order to prevent erroneous pulses which cannot be filtered by the control circuit from disrupting the operation of said control circuit. The method makes it possible in particular to remove the spurious pulses leading to a "latch-up" effect in the ASIC control circuit which permanently latches it up, for example at "1". The method according to the invention thus makes it possible to overcome the lack of robustness of the components of the control circuit. The method also makes it possible to correct a programming error which would permanently activate the control signal by limiting the duration of a high state of the signal to the duration of the maximum time interval over a given period. Adapting the control signal in this way thus makes it possible to decrease or even eliminate instability in the closed-loop control of the injectors.

It should be noted that, starting from the prior art, an obvious solution would consist in using an RC circuit to filter the portions of the PWM control signal for which the duty cycle is below a predetermined threshold (for example 1%), but such solution would not be satisfactory because such an RC circuit would distort the PWM control signal, which would have the same drawbacks as the other solutions of the prior art, although possibly somewhat attenuated. In addition, a simple analog filter, of any order, would not be able to have a fast enough reaction time at the frequencies used, for example higher than or equal to 150 kHz.

Advantageously, the method further comprises a step of determining the current period of the control signal.

Again advantageously, the method comprises a preliminary step of determining the duration of the minimum time interval and the duration of the maximum time interval.

Preferably, the duration of the minimum time interval is between 1 and 5% of the period corresponding to the maximum frequency of the control signal.

Again preferably, the duration of the maximum time interval is between 95 and 99% of the period corresponding to the minimum frequency of the control signal.

Another subject of the present invention is a computer for adapting a control signal of a control circuit for at least one injector of a combustion engine of a vehicle, said control signal being a voltage-pulse signal of variable frequency varying between a minimum frequency and a maximum frequency and which is characterized over a given period by its duty cycle. Said computer is noteworthy in that it is configured, for a given period of the control signal, for:

detecting the first pulse in the given period;
  when the duration of said detected first pulse is shorter than the duration of a predetermined minimum time interval beginning at the start of the given period and said duration of which is dependent on the maximum frequency, modifying the duration of the detected first pulse so that said duration becomes equal to the duration of said predetermined minimum time interval;
  when the duration of the detected first pulse is longer than the duration a predetermined maximum time interval starting at the beginning of the given period and said duration of which is dependent on the minimum frequency, modifying the duration of the detected first pulse so that said duration becomes equal to the duration of said predetermined maximum time interval;
  when the control signal becomes zero after the end of the detected first pulse, the duration of which has optionally been modified, removing any other pulse detected at the end of the given period.

According to one aspect of the invention, the computer is configured to determine the current period of the control signal.

According to one aspect of the invention, the computer is configured to determine the duration of the minimum time interval and the duration of the maximum time interval.

Preferably, the duration of the minimum time interval is between 1 and 5% of the period corresponding to the maximum frequency of the control signal.

Again preferably, the duration of the maximum time interval is between 95 and 99% of the period corresponding to the minimum frequency of the control signal.

Preferably, the computer comprises a microcontroller, a control circuit and a power stage.

Advantageously, the control circuit is an ASIC (application specific integrated circuit).

Lastly, the invention relates to a motor vehicle comprising a computer such as presented above and a combustion engine comprising a plurality of cylinders and a plurality of fuel injectors for injecting fuel into said cylinders, said computer being capable of controlling said plurality of injectors on the basis of at least one control signal adapted by said computer.

BRIEF DESCRIPTION OF THE DRAWINGS

Other features and advantages of the invention will become apparent from the following description, provided with reference to the appended figures which are given by way of non-limiting example and in which the same reference signs are given to similar objects.

FIG. 3A shows an example of a control signal transmitted by the microcontroller.

FIG. 3B shows an example of the control signal of FIG. 3A as received by the control circuit.

FIG. 3C is an example of a signal showing the intervals of minimum duration.

FIG. 3D is an example of a signal showing the intervals of maximum duration.

FIG. 3E is an example of a reference signal showing the intervals the duration of which is a half-period of the control signal of FIG. 3B.

FIG. 3F shows the control signal of FIG. 3B adapted using the method according to the invention.

DESCRIPTION OF THE PREFERRED EMBODIMENTS

The vehicle described in the example below is a motor vehicle including a combustion engine with a plurality of cylinders. However, it should be noted that the invention applies more broadly to any type of vehicle with a combustion or hybrid engine, the number of cylinders being greater than or equal to one.

Figure 1:
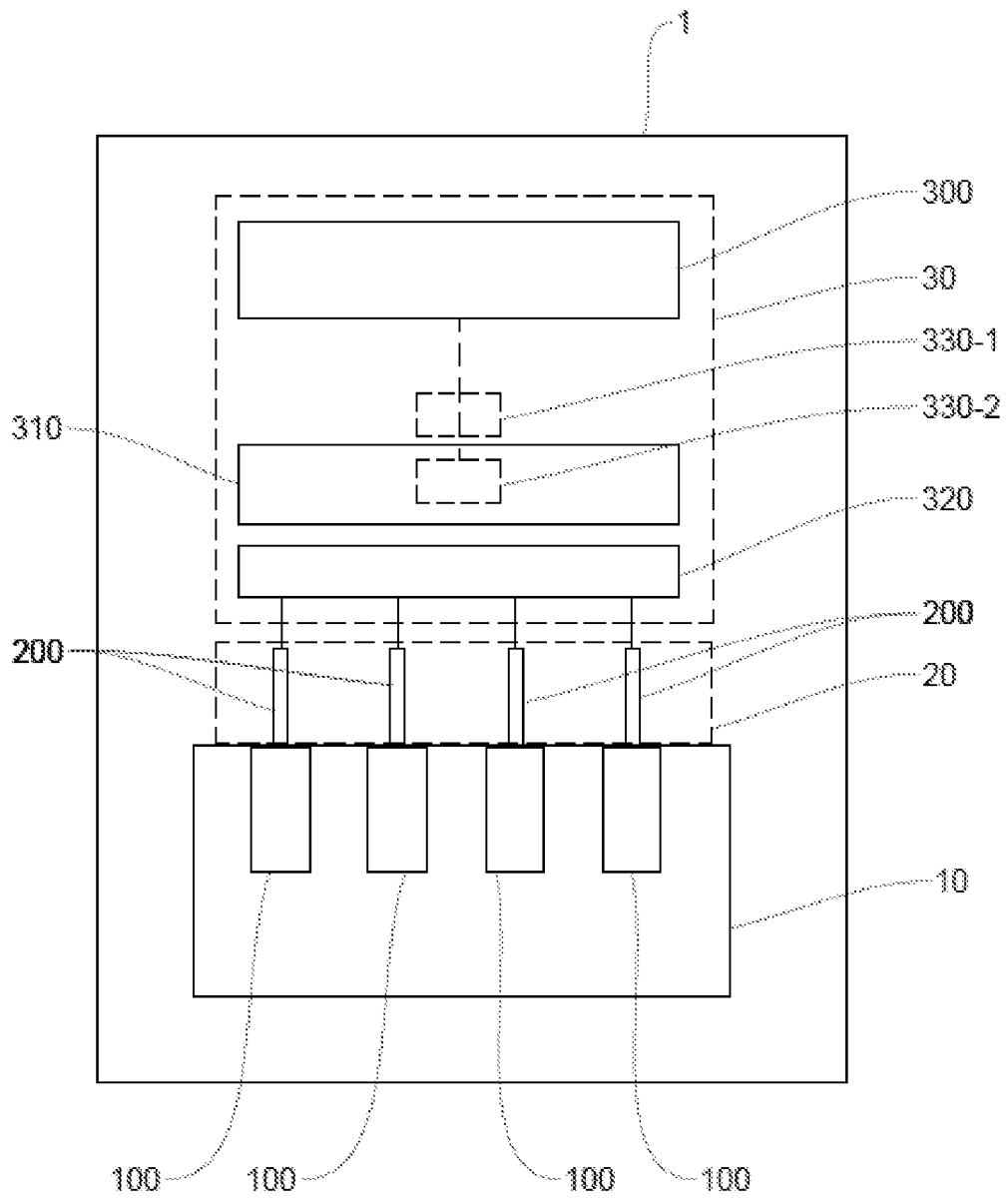
FIG. 1 schematically illustrates one embodiment of the vehicle according to the invention.

FIG. 1 schematically shows an example of a vehicle 1 according to the invention comprising a combustion engine 10, a system 20 for injecting fuel into said engine 10 and a computer 30, known as the "engine control computer", for controlling said injection system 20.

The engine 10 comprises a plurality of cylinders 100 in each of which a mixture of oxidant (air) and fuel is combusted.

The injection system 20 comprises a plurality of fuel injectors 200, at least one injector 200 being mounted on each of the cylinders 100.

The injection system 20 may also comprise a pump (not shown) and an injection rail (not shown).

The intake of air into a cylinder 100 takes places via one or more air intake valves (not shown) while the fuel is introduced into said cylinder 100 via the corresponding injector 200.

The computer 30 is configured to control the injectors 200 so that they inject the fuel at the appropriate time in the cycle of each cylinder 100.

To this end, the computer 30 comprises in particular a microcontroller 300, a control circuit 310 electrically connected to said microcontroller 300 and a power stage 320 connected to the plurality of injectors 200.

The microcontroller 300 is configured to generate a control signal $S_C$ for controlling each injector 200 and to send said control signals $S_C$ to the control circuit 310. The control circuit 310 transforms these control signals $S_C$ into control signals for controlling the injectors 200. The power stage 320 adjusts the power of the corresponding injector 200 control signals so as to control the opening and closing thereof.

The control signal $S_C$ is a voltage-pulse signal, of variable frequency varying between a minimum frequency and a maximum frequency, characterized over a period by its duty cycle.

For example, the frequency may vary between a minimum frequency equal to 150 kHz and a maximum frequency equal to 170 kHz. It goes without saying, however, that any other minimum frequency and maximum frequency values suitable for the intended application could be used.

Preferably, the microcontroller 300 generates a PWM (pulse width modulation) control signal $S_C$ which takes the form of a succession of periods, the duration of which may vary with time.

Over each period T, the control signal $S_C$ may take a positive value (high state or pulse) and/or a zero value (low state). For a given period, the ratio of the duration of the high signal to the duration of the period constitutes the duty cycle.

So, for example:
if the signal value is zero (low state) over an entire period, the duty cycle is 0% over this period,
if the signal value corresponds to the value of the pulse (high state) over an entire period, the duty cycle is 100% over this period,
if the value of the signal corresponds to the value of the pulse (high state) over the first half of a period and is zero (low state) over the second half of said period, the duty cycle is 50% over this period, etc.

The variations in the duty cycle make it possible to indicate to the control circuit 310 how the injector 200 is to be controlled.

In this preferred example, the microcontroller 300 is programmed to generate a control signal $S_C$ comprising, in each period, a high state beginning at the start of the period and the duration of which defines, with the duration of the period in question, the duty cycle of the control signal $S_C$ for this period.

However, in practice, the control signal $S_C$ which is received by the control circuit 310 may include errors, called spurious pulses, which are in particular due to electromagnetic interference in the microcontroller 300 or in the control circuit 310, to electrical-track routing problems, coupling problems, calculation errors in the feedback control (for example due to a coding error), etc.

The spurious pulses can appear in the control signal $S_C$ received at the input of the control circuit 310 in two ways: either the spurious pulse corresponds to a momentary high state of the control signal $S_C$ during a programmed low state of said control signal $S_C$, or, conversely, the pulse corresponds to a low state of the control signal $S_C$ in the middle of a programmed high state of the control signal $S_C$.

FIGS. 3A and 3B show two examples of a control signal $S_C(E)$, $S_C(R)$ comprising such errors: a control signal $S_C(E)$ generated with three errors by the microcontroller 300 as sent by said microcontroller 300 to the control circuit 310 (FIG. 3A) and the corresponding control signal $S_C(R)$ as received by said control circuit 310 with a fourth error (FIG. 3B), for example generated during its transmission between the microcontroller 300 and the control circuit 310.

The computer 30 according to the invention is configured to detect and correct these errors in the control signal $S_C(E)$, $S_C(R)$ by adapting said control signal $S_C(E)$, $S_C(R)$ so that the control circuit 310 controls the injector 200 using a suitable (i.e. corrected) control signal $S_C(F)$, illustrated in FIG. 3F.

These tasks are assigned to an adaptation module 330-1, 330-2 (illustrated in FIG. 1).

In a first embodiment (software solution), these functions are performed by computer program implemented by an adaptation module 330-1 arranged between the microcontroller 300 and the control circuit 310. This adaptation module 330-1 may for example be a second microcontroller.

In a second embodiment (hardware solution), these functions are performed by an adaptation module 330-2 incorporated within the control circuit 310 at the input of said control circuit 310, i.e. upon reception of the control signal $S_C(R)$ by the control circuit 310.

The adaptation module 330-1, 330-2 is configured for:
determining the start time of a given period of the control signal $S_C$ (R);
detecting the first pulse in the given period from said start time;
when said detected first pulse is within a predetermined minimum time interval beginning at the start of the given period and which is dependent on the maximum frequency, modifying the duration of the detected first pulse so that said duration becomes equal to the duration of said predetermined minimum time interval;
when the duration of the detected first pulse is longer than the duration of a predetermined maximum time interval beginning at the start of the given period and which is dependent on the minimum frequency, modifying the duration of the detected first pulse so that it becomes equal to the duration of said predetermined maximum time interval;
when the control signal $S_C(R)$ becomes zero, removing any other pulse detected at the end of the given period.

Figure 2:
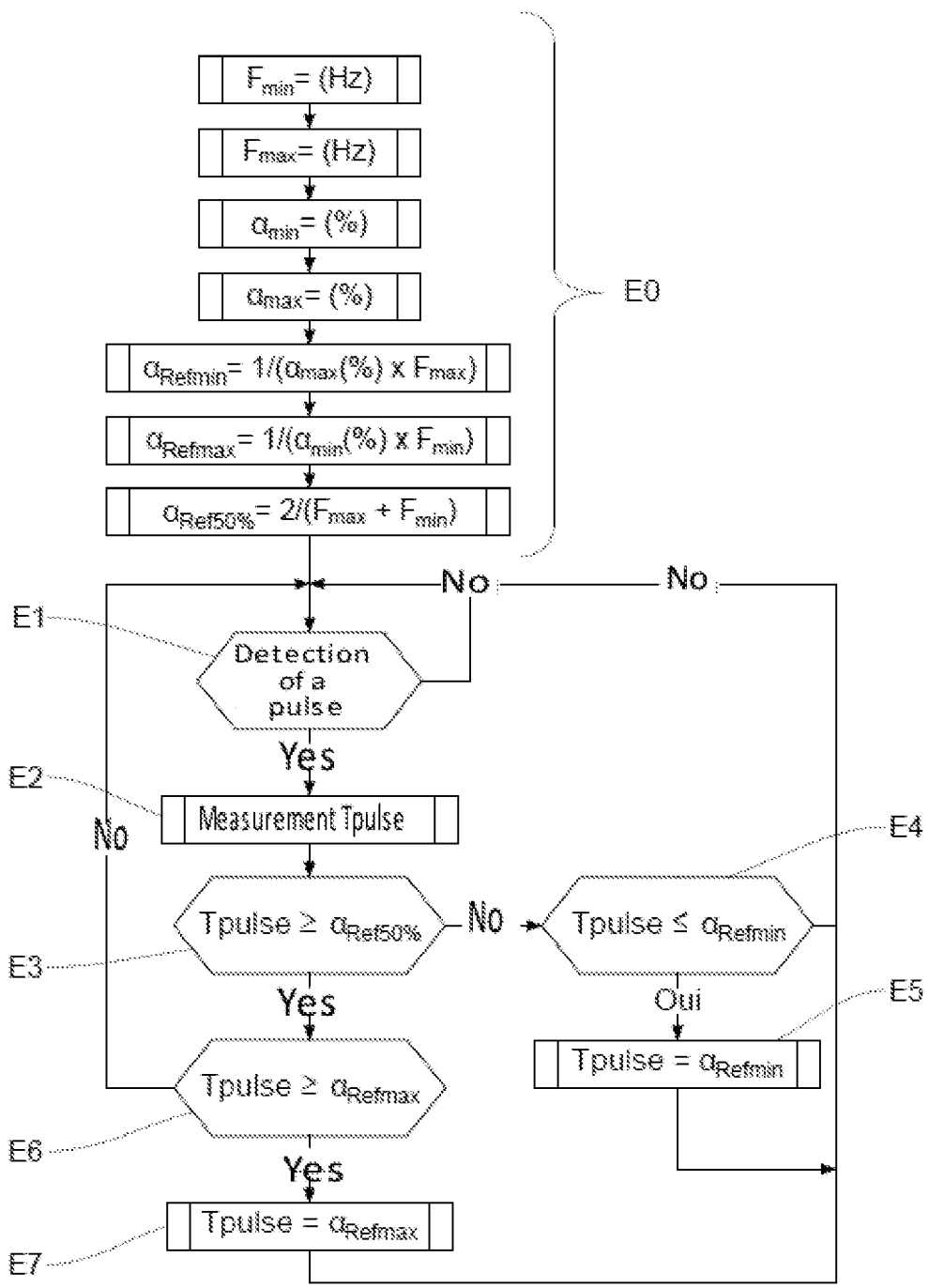
FIG. 2 schematically illustrates one embodiment of the method according to the invention.

The invention will now be described in terms of the implementation thereof with reference to FIG. 2.

In a preliminary step E0, the following are defined:
the minimum frequency Fmin of the control signal $S_C(R)$, for example 150 kHz;
the maximum frequency Fmax of the control signal $S_C(R)$, for example 170 kHz;
the percentage αmin of the period corresponding to the minimum time interval;
the percentage αmax of the period corresponding to the maximum time interval;
the duration of the minimum time interval:

$$\alpha Ref\min = \frac{1}{\alpha\max \times F\max};$$

the duration of the maximum time interval:

$$\alpha Ref\max = \frac{1}{\alpha\min \times F\min};$$

the duration αRef50% of the half-period of the control signal $S_C(R)$:

$$-\alpha Ref 50\% = \frac{2}{F\min + F\max}.$$

Preferably, the duration αRefmin of the minimum time interval αmin is between 1 and 5% of the period corresponding to the maximum frequency Fmax of the control signal $S_C(E)$, $S_C(R)$. Similarly, preferably, the duration αRefmax of the maximum time interval αmax is between 95 and 99% of the period corresponding to the minimum frequency Fmin of the control signal $S_C(E)$, $S_C(R)$.

Also defined is a reference signal PWM_ref_50% of the same frequency as the control signal $S_C(E)$, $S_C(R)$ for a given period but the duty cycle of which is 50%, the reference signal PWM_ref_50% being in the high state for the first half of the period and in the low state for the second half of the period.

FIGS. 3C, 3D and 3E show in the form, respectively, of high states of a signal PWM_ref_min the minimum time intervals, of a signal PWM_ref_max the maximum time intervals and of a signal PWM_ref_50% the reference time intervals, the duration of each interval of which is equal to the (first) half of the duration of the period of the control signal $S_C(E)$, $S_C(R)$.

By way of example, with a maximum frequency of 170 kHz, the duration of the minimum time interval is chosen to be in the interval [58-294] nanoseconds, and with a minimum frequency of 150 kHz, the maximum threshold is chosen to be in the interval [6.33-6.6] microseconds.

For each period of the signal, the adaptation module 330-1, 330-2 first determines the start time of said period and the first pulse in the period in a step E1.

The adaptation module 330-1, 330-2 measures the duration Tpulse of the first pulse in the period in a step E2.

The adaptation module 330-1, 330-2 determines whether the duration Tpulse of the first pulse in the period is or is not longer than or equal to the duration αRef50% of a half-period of the control signal $S_C(R)$ in a step E3.

If the duration Tpulse of the first pulse in the period is shorter than the duration αRef50% of a half-period of the control signal $S_C(R)$, the adaptation module 330-1, 330-2 determines, in a step E4, whether the duration Tpulse of the first pulse in the period is or is not shorter than the duration αRefmin of the minimum time interval beginning at the start of the given period and which is dependent on the maximum frequency.

If the duration Tpulse of the detected first pulse is shorter than the duration αRefmin of the minimum time interval of the given period, the adaptation module 330-1, 330-2 modifies, in a step E5, the duration Tpulse of the detected first pulse so that said duration Tpulse becomes equal to the duration αRefmin of said minimum time interval.

If the duration Tpulse of the first pulse in the period is longer than or equal to the duration αRef50% of a half-period of the control signal $S_C(R)$, the adaptation module 330-1, 330-2 determines, in a step E6, whether the duration Tpulse of the first pulse in the period is or is not longer than or equal to the duration αRefmax of the maximum time interval beginning at the start of the given period and which is dependent on the minimum frequency.

If the duration Tpulse of the detected first pulse is longer than the duration αRefmax of the maximum time interval of the given period, the adaptation module 330-1, 330-2 modifies, in a step E7, the duration Tpulse of the detected first pulse so that it becomes equal to the duration αRefmax of said maximum time interval.

When the control signal becomes zero, the adaptation module 330-1, 330-2 removes any other pulse which would subsequently be detected at the end of the period considered.

As mentioned above, FIG. 3A shows an example of a control signal $S_C(E)$ generated by the microcontroller comprising three abnormal pulses. The control signal $S_C(R)$ received by the control circuit 310 comprises a fourth error, for example due to electromagnetic interference during its transmission between the microcontroller 300 and said control circuit 310.

The abnormal pulse A is the only pulse in the period in question and its duration Tpulse is longer than the duration αRefmax of the maximum time interval of the period in question, represented by the high state of the signal PWM_ref_max. In this case, the duration Tpulse of the pulse is decreased in the control signal $S_C(R)$ such that its duration Tpulse is equal to the duration αRefmax of the maximum time interval.

The abnormal pulse B is located in the second half of the period of the signal PWM_ref_50%, i.e. during the low state of this median reference signal. In this case, the pulse is removed from the control signal $S_C(R)$.

The abnormal low state C is in the first half of the period in question of the reference signal PWM_ref_50% and its duration Tpulse is shorter than the duration αRefmin of the minimum time interval, i.e. shorter than the duration of the high state of the signal PWM_ref_min. In this case, the duration Tpulse of the pulse is increased in the control signal $S_C(F)$ such that its duration is at least equal to the duration αRefmin of the minimum time interval. In this instance, the extension of the duration Tpulse of the detected first pulse over the period makes it possible to remove the abnormal low state C from the control signal $S_C(R)$, which represented an error in said control signal $S_C(R)$, and to obtain a high state of the control signal $S_C(R)$ in accordance with what the microcontroller 300 had generated to control the one or more injectors 200.

The abnormal pulse D is in the first half of the period in question of the reference signal PWM_ref_50% and its duration Tpulse is shorter than the duration αRefmin of the minimum time interval, i.e. shorter than the duration of the high state of the signal PWM_ref_min. In this case, the duration Tpulse of the pulse is increased in the control signal $S_C(F)$ such that its duration Tpulse is equal to the duration αRefmin of the minimum time interval.

The control signal $S_C(F)$ obtained in the end, illustrated in FIG. 3F, is a filtered control signal $S_C(F)$ in which the errors A, B, C and D have been corrected so as to avoid latching up the control circuit 310.

The method according to the invention advantageously makes it possible to adapt the control signal $S_C(R)$ received by the control circuit 310 so as to remove the errors which may cause the control circuit 310 to latch up and the injectors 200 to be controlled incorrectly.

The invention claimed is:

1. A method for adapting a control signal ($S_C$) of a control circuit (310) for at least one injector (200) of a combustion engine (10) of a motor vehicle (1), said control signal ($S_C$) being a voltage-pulse signal of variable frequency varying between a minimum frequency and a maximum frequency and which is characterized over a given period by its duty cycle, said method comprising, for a given period of the control signal ($S_C$), the steps of:
    detecting (E1) the first pulse in the given period;
    when the duration (Tpulse) of said detected first pulse is shorter than the duration (αRefmin) of a predetermined minimum time interval beginning at the start of the given period and said duration of which is dependent on the maximum frequency (Fmax), modifying (E5) the duration (Tpulse) of the detected first pulse so that said duration (Tpulse) becomes equal to the duration (αRefmin) of said predetermined minimum time interval;

when the duration (Tpulse) of the detected first pulse is longer than the duration (αRefmax) of a predetermined maximum time interval starting at the beginning of the given period and said duration of which is dependent on the minimum frequency (Fmin), modifying (E7) the duration (Tpulse) of the detected first pulse so that said duration (Tpulse) becomes equal to the duration (αRefmax) of said predetermined maximum time interval;

when the control signal ($S_C$) becomes zero after the end of the detected first pulse, the duration of which has optionally been modified, removing any other pulse detected at the end of the given period.

2. The method as claimed in claim 1, further comprising a step (E1) of determining the current period of the control signal ($S_C$).

3. The method as claimed in claim 1, comprising a preliminary step (E0) of determining the duration of the minimum time interval and the duration of the maximum time interval.

4. The method as claimed in claim 1, wherein the duration of the minimum time interval is between 1 and 5% of the period corresponding to the maximum frequency of the control signal.

5. The method as claimed in claim 1, wherein the duration of the maximum time interval is between 95 and 99% of the period corresponding to the minimum frequency of the control signal.

6. A computer (30) for adapting a control signal ($S_C$) of a control circuit (310) for at least one injector (200) of a combustion engine (10) of a vehicle (1), said control signal ($S_C$) being a voltage-pulse signal of variable frequency varying between a minimum frequency and a maximum frequency and which is characterized over a given period by its duty cycle, said computer (30) being configured, for a given period of the control signal ($S_C$), for:

detecting the first pulse in the given period;

when the duration (Tpulse) of said detected first pulse is shorter than the duration (αRefmin) of a predetermined minimum time interval beginning at the start of the given period and said duration (αRefmin) of which is dependent on the maximum frequency (Fmax), modifying the duration (Tpulse) of the detected first pulse so that said duration (Tpulse) becomes equal to the duration (αRefmin) of said predetermined minimum time interval;

when the duration (Tpulse) of the detected first pulse is longer than the duration (αRefmax) of a predetermined maximum time interval starting at the beginning of the given period and said duration of which is dependent on the minimum frequency (Fmin), modifying the duration (Tpulse) of the detected first pulse so that said duration (Tpulse) becomes equal to the duration (αRefmax) of said predetermined maximum time interval;

when the control signal becomes zero after the end of the detected first pulse, the duration (Tpulse) of which has optionally been modified, removing any other pulse detected at the end of the given period.

7. The computer (30) as claimed in claim 6, configured to determine the current period of the control signal ($S_C$).

8. The computer (30) as claimed in claim 6, configured to determine the duration of the minimum time interval and the duration of the maximum time interval.

9. The computer (30) as claimed in claim 6, wherein the duration of the minimum time interval is between 1 and 5% of the period corresponding to the maximum frequency of the control signal and the duration of the maximum time interval is between 95 and 99% of the period corresponding to the minimum frequency of the control signal.

10. A motor vehicle (1) comprising:
a computer (30) as claimed in claim 6;
a combustion engine (10) comprising a plurality of cylinders (100) and a plurality of fuel injectors (200) for injecting fuel into said cylinders (100);
said computer (30) being capable of controlling said plurality of injectors (200) on the basis of at least one control signal ($S_C$) adapted by said computer (30).

11. The method as claimed in claim 2, comprising a preliminary step (E0) of determining the duration of the minimum time interval and the duration of the maximum time interval.

12. The method as claimed in claim 2, wherein the duration of the minimum time interval is between 1 and 5% of the period corresponding to the maximum frequency of the control signal.

13. The method as claimed in claim 3, wherein the duration of the minimum time interval is between 1 and 5% of the period corresponding to the maximum frequency of the control signal.

14. The method as claimed in claim 2, wherein the duration of the maximum time interval is between 95 and 99% of the period corresponding to the minimum frequency of the control signal.

15. The method as claimed in claim 3, wherein the duration of the maximum time interval is between 95 and 99% of the period corresponding to the minimum frequency of the control signal.

16. The method as claimed in claim 4, wherein the duration of the maximum time interval is between 95 and 99% of the period corresponding to the minimum frequency of the control signal.

17. The computer (30) as claimed in claim 7, configured to determine the duration of the minimum time interval and the duration of the maximum time interval.

18. The computer (30) as claimed in claim 7, wherein the duration of the minimum time interval is between 1 and 5% of the period corresponding to the maximum frequency of the control signal and the duration of the maximum time interval is between 95 and 99% of the period corresponding to the minimum frequency of the control signal.

19. The computer (30) as claimed in claim 8, wherein the duration of the minimum time interval is between 1 and 5% of the period corresponding to the maximum frequency of the control signal and the duration of the maximum time interval is between 95 and 99% of the period corresponding to the minimum frequency of the control signal.

20. A motor vehicle (1) comprising:
a computer (30) as claimed in claim 7;
a combustion engine (10) comprising a plurality of cylinders (100) and a plurality of fuel injectors (200) for injecting fuel into said cylinders (100);
said computer (30) being capable of controlling said plurality of injectors (200) on the basis of at least one control signal ($S_C$) adapted by said computer (30).

* * * * *